(12) United States Patent
Klodowski et al.

(10) Patent No.: US 8,676,386 B2
(45) Date of Patent: Mar. 18, 2014

(54) FAULT DETECTION SYSTEM FOR A GENERATOR

(75) Inventors: Anthony Michael Klodowski, Hardy, VA (US); Sidney Allen Barker, Troutville, VA (US)

(73) Assignee: General Electric Company, Schenectady, NY (US)

(*) Notice: Subject to any disclaimer, the term of this patent is extended or adjusted under 35 U.S.C. 154(b) by 362 days.

(21) Appl. No.: 13/222,441

(22) Filed: Aug. 31, 2011

(65) Prior Publication Data

US 2013/0054043 A1 Feb. 28, 2013

(51) Int. Cl.
*G06F 19/00* (2011.01)

(52) U.S. Cl.
USPC .............................. 700/276; 702/58

(58) Field of Classification Search
USPC .............. 700/276, 293, 287, 272; 380/270; 701/19; 702/58
See application file for complete search history.

(56) References Cited

U.S. PATENT DOCUMENTS

| | | | |
|---|---|---|---|
| 4,862,308 A * | 8/1989 | Udren | 361/45 |
| 4,881,028 A * | 11/1989 | Bright | 324/127 |
| 4,920,306 A | 4/1990 | Mard et al. | |
| 6,111,733 A * | 8/2000 | Neiger et al. | 361/42 |
| 6,288,515 B1 | 9/2001 | Hiti et al. | |
| 6,304,052 B1 | 10/2001 | O'Meara et al. | |
| 6,407,899 B1 | 6/2002 | Carpenter | |
| 6,504,329 B2 | 1/2003 | Stancu et al. | |
| 7,042,181 B2 | 5/2006 | Nagakura | |
| 7,321,500 B2 * | 1/2008 | Asplund et al. | 363/35 |
| 7,619,869 B2 * | 11/2009 | Boeder et al. | 361/115 |
| 7,663,849 B2 | 2/2010 | Shah et al. | |
| 2010/0080022 A1 | 4/2010 | Schmidt | |
| 2013/0049363 A1 | 2/2013 | Smith | |

OTHER PUBLICATIONS

U.S. Non-Final Office Action dated Apr. 9, 2013 for U.S. Appl. No. 13/222,397, filed Aug. 31, 2011.

* cited by examiner

*Primary Examiner* — Kidest Bahta
(74) *Attorney, Agent, or Firm* — Cantor Colburn LLP (57) ABSTRACT

A fault detection system is provided, and includes a generator, a power converter, a breaker, a current monitoring device, and a control module. The power converter is selectively connected to the generator and is selectively activated to produce a test voltage. The breaker is located between the generator and the power converter for selectively connecting the generator to the power converter. The breaker includes an open position and a closed position. The current monitoring device is located between the generator and the power converter. The current monitoring device measures a line current between the generator and the power converter. The control module is in communication with the current monitoring device and the power converter. The control module has a memory with a threshold current value.

20 Claims, 5 Drawing Sheets

FAULT DETECTION SYSTEM FOR A GENERATOR

BACKGROUND OF THE INVENTION

The subject matter disclosed herein relates to a fault detection system system, and more specifically to a fault detection system including a generator and a power converter that is selectively connected to the generator.

Wind turbines are one alternative to conventional sources of energy. A wind turbine includes multiple blades that are connected to a rotor, where spinning of the blades by wind spins a shaft of the rotor. The rotor is connected to a generator that generates electricity. Some wind turbines include a gearbox that couples the rotor to the generator. Various types of generators are employed in wind turbines such as, for example, induction machines and separately excited synchronous machines. Specifically, one type of generator that may be employed is a permanent magnet generator. The permanent magnet generator allows for higher efficiency but, because the permanent magnet generator is excited by permanent magnets, the permanent magnet generator is almost always capable of producing voltage when spinning Thus, as long as the permanent magnet generator is spinning, voltage will typically be produced. However, a fault may occur on the output of the permanent magnet generator while voltage is being produced. Thus, a breaker may be provided to the output of the generator to generally prevent the current flow in the event of a fault.

A power converter system may also be employed to convert the variable frequency electrical output power of the generator to an AC electrical power that matches the frequency of an electrical grid. Sometimes the power converter is not activated. For example, the power converter may not be activated if there is not adequate wind, maintenance work is being performed on the wind turbine, or in the event the wind turbine is nonoperational.

A fault may occur between the cables that connect the generator to the power converter. For example, the fault may be a short or an open circuit. In the event the power converter is activated, detection of a fault between the generator and the power converter is typically relatively simple to detect. While operating, both the power converter and the breakers an internal trip relay will detect the fault. The power converter will shut down and the breaker will open. However, in the event the power converter is not activated, this fault may go undetected. When a generator breaker is in a closed position, the power converter may or may not be activated. One approach for detecting a fault between the generator and the power converter when the power converter is not activated but the breaker is closed involves employing an internal trip relay in the generator main circuit breaker. However, the internal trip relay may not always be reliable at lower frequencies, and may also be prone to overheating while the power converter is activated due to the current harmonics produced by the power converter.

BRIEF DESCRIPTION OF THE INVENTION

According to one aspect of the invention, a fault detection system is provided, and includes a generator, a power converter, a breaker, a current monitoring device, and a control module to detect a fault when the breaker is in the open position. The power converter is selectively connected to the generator and is selectively activated to produce a test voltage. The breaker is located between the generator and the power converter for selectively connecting the generator to the power converter. The breaker includes an open position and a closed position. The current monitoring device is located between the generator and the power converter. The current monitoring device measures a line current between the generator and the power converter. The control module is in communication with the current monitoring device and the power converter. The control module has a memory with a threshold current value. The control module includes control logic for monitoring the breaker to determine if the breaker is in one of the open position and the closed position. The control module includes control logic for activating the power converter to produce the test voltage if the breaker is in the open position. The control module includes control logic for monitoring the current monitoring device for the line current. The control module includes control logic for determining if the line current is greater than the threshold current during a period of time while the test voltage is being produced. The control module includes control logic for determining that a fault is present if the breaker is in the open position and if the line current is greater than the threshold current. In one embodiment, the control module includes control logic for maintaining the breakers in the open position if the fault is detected. In another embodiment, a voltage monitoring device is provided between the generator and the power converter for measuring a line voltage, and the control module is in communication with the voltage monitoring device.

According to another aspect of the invention, a wind power plant having a fault detection system is provided having a wind turbine, a gearbox connected to the wind turbine through a shaft, a generator connected to the shaft, a power converter, a breaker, a current monitoring device, a voltage monitoring device, and a control module. The power converter is selectively connected to the generator for being selectively activated to produce a test voltage. The breaker is located between the generator and the power converter for selectively connecting the generator to the power converter. The breaker includes an open position and a closed position. The current monitoring device is located between the generator and the power converter. The current monitoring device measures a line current. The voltage monitoring device is provided between the generator and the power converter for measuring a line voltage. The control module is in communication with the current monitoring device, the voltage monitoring device, the generator, the breaker and the power converter. The control module has a memory with a threshold current, a threshold voltage, and an expected voltage stored therein.

The control module includes control logic for monitoring the breaker to determine if the breaker is in one of the open position and the closed position. The control module includes control logic for activating the power converter to produce the test voltage if the breaker is in the open position. The control module includes control logic for monitoring the current monitoring device for the line current. The control module includes control logic for determining if the line current is greater than the threshold current during a period of time while the test voltage is being produced. The control module includes control logic for determining that a fault is present if the breaker is in the open position and if the line current is greater than the threshold current or if the line voltage differs from the expected voltage by a specified voltage value. The control module includes control logic for calculating a measured voltage of the generator. The measured voltage of the generator is based on the line voltage, the line current, a cable resistance value, a cable inductance value, an internal inductance of the power converter and at least one parameter of the generator. The control module includes control logic for calculating an estimated voltage of the generator. The estimated voltage of the generator is based on the rotational speed of the generator, the line current, and the at least one parameter of the generator. The control module includes control logic for calculating a magnitude of the measured voltage of the generator and a magnitude of the estimated voltage of the generator. The control module includes control logic for determining the difference between the magnitude of the measured voltage of the generator and the magnitude of the estimated voltage of the generator. The control module includes control logic for determining a generator fault is present if the difference between the magnitude of the estimated voltage of the generator and the magnitude of the measured voltage of the generator is greater than the threshold voltage, and if the breaker is in the closed position.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

As used herein the terms module and sub-module refer to an application specific integrated circuit (ASIC), an electronic circuit, a processor (shared, dedicated, or group) and memory that executes one or more software or firmware programs, a combinational logic circuit, and/or other suitable components that provide the described functionality.

Figure 1:
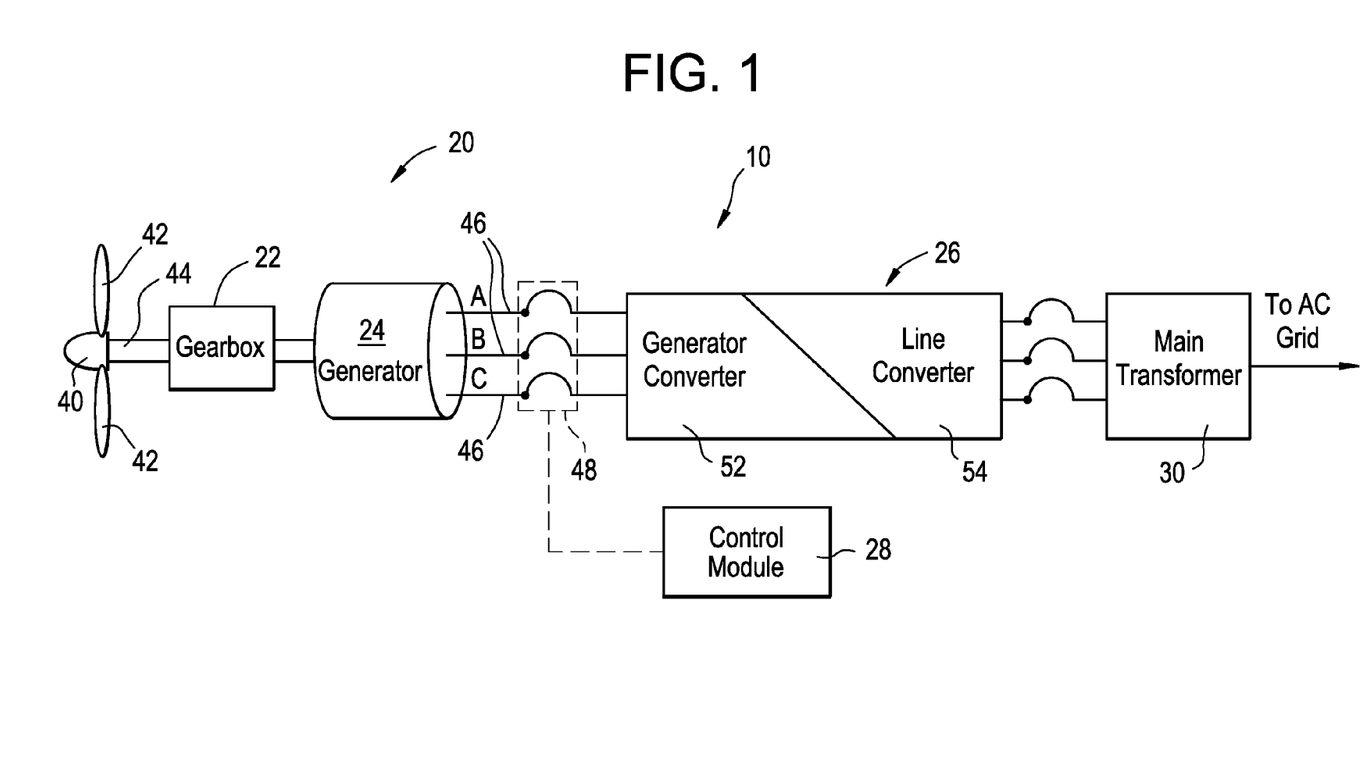
FIG. 1 is a schematic illustration of an exemplary wind power plant having a fault detection system.
Figure 2:
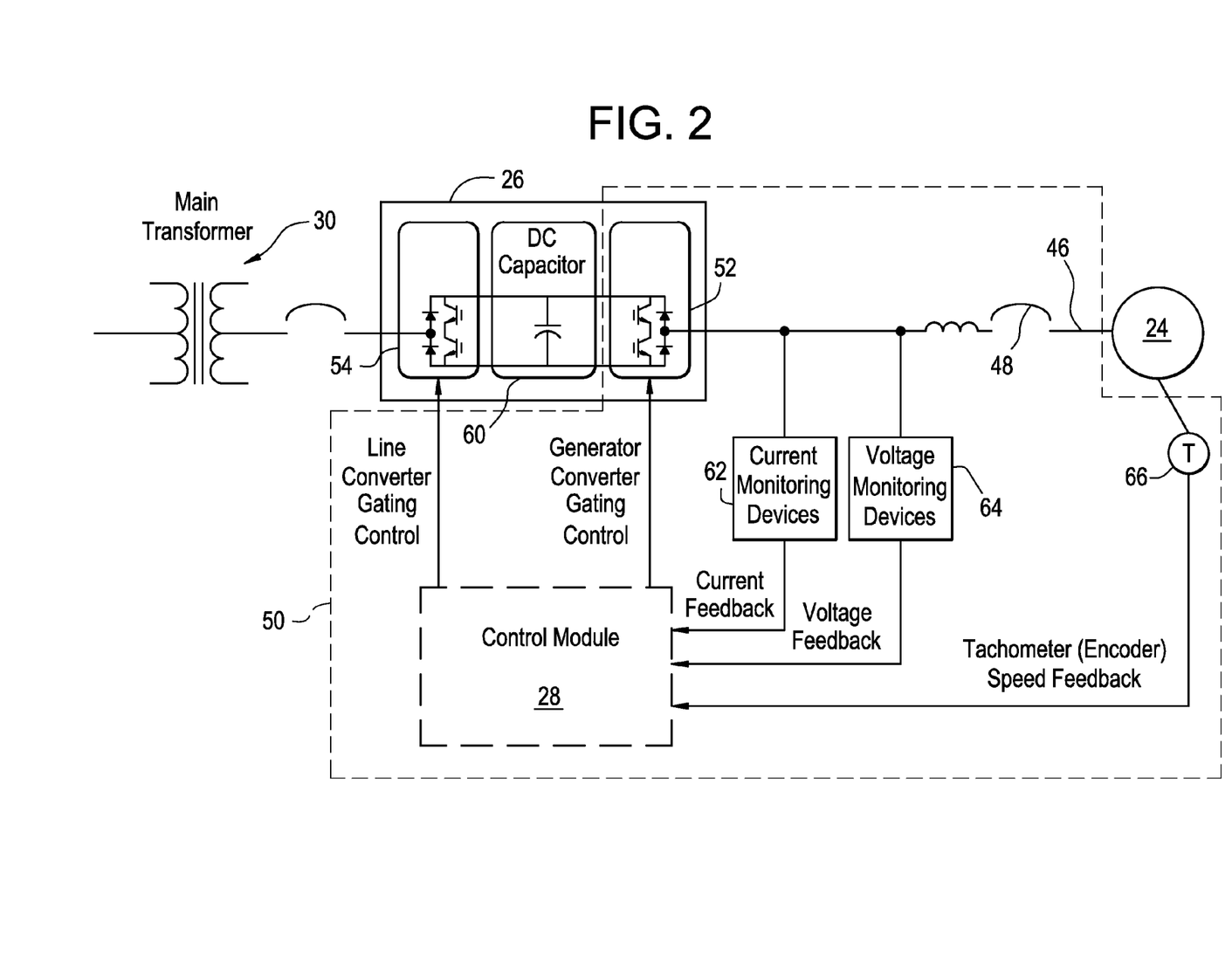
FIG. 2 is a single line diagram of the fault detection system illustrated in FIG. 1.

Referring now to FIG. 1, a schematic exemplary wind power plant 10 is illustrated. The wind power plant 10 includes a wind turbine 20, a gearbox 22, a generator 24, a main power convertor 26, a converter controller 28, and a main transformer 30. The wind turbine 20 includes a hub 40 and a plurality of rotor blades 42 that are connected to the hub 40. A shaft 44 transfers energy from the wind turbine 20 to the generator 24 through the gearbox 22. The rotational speed of the shaft 44 is dependent on wind speed. The generator 24 is typically any type of machine that converts the mechanical energy from the shaft 44 into electrical energy such as, for example, a permanent magnet generator. Typically, a set of three connections 46 of the generator 24 are connected to the main power converter 26, and are labeled as 'A', 'B' and 'C'. Each of the connections 46 also include a breaker 48 for selectively interrupting the flow of current between the generator 24 and the main power converter 26. In one embodiment, the breaker 48 may be a three-phase breaker. Referring now to FIGS. 1-2, a fault detection system 50 is employed for detecting faults between the generator 24 and the main power converter 26. For example, the fault detection system 50 may be able to detect a short or open circuit condition between the generator 24 and the main power converter 26. The fault detection system 50 may also determine if a tachometer 66 (shown in FIG. 2) measuring the rotational speed of the generator 24 is not functioning. Although FIG. 1 illustrates a wind power plant 10, it is to be understood that the generator 24 and the main power convertor 26 may be used in other applications as well.

The main power convertor 26 generally includes circuitry for converting the variable frequency AC voltage from the generator 24 into a voltage that may be supplied to an AC grid (not shown). Specifically, the main power converter 26 is selectively activated to produce an output voltage, which is the AC voltage supplied to the AC grid. The main power converter 26 may include various power switching devices such as, for example, insulated gate bipolar transistors (IGBTs) or integrated gate-commutated thyristors (IGCTs). The power converter 26 includes a generator side converter 52 and a grid or line side converter 54. The generator side converter 52 receives an AC input voltage from the generator 24 and provides for conversion of the AC input voltage into a DC voltage. The generator side converter 52 provides the DC voltage to the line side converter 54 through a DC bus that includes a DC link capacitor 60 (shown in FIG. 2). The grid side converter 54 converts the DC voltage to an AC output voltage that is fed to the AC grid (not shown).

Breaker 48 includes a closed position as well as an open position. In the closed position, current may flow in the connections 46 between the generator 24 and the main power converter 26. In the open position, current is generally unable to flow in the connections 46 between the generator 24 and the main power converter 26. Thus, the breaker 48 selectively connects the generator 24 to the main power converter 26.

FIG. 2 is a single line diagram of a portion of the wind turbine 10 including the fault detection system 50. A current monitoring device 62 and a voltage monitoring device 64 are each located between the generator 24 and the main power converter 26. The current monitoring device 62 measures a line current of the connection 46 between the generator 24 and the main power converter 26. Specifically, referring to FIG. 3, an illustration of three current monitoring devices 62 measuring the specific line currents associated with connections 'A', 'B' and 'C' is shown. Referring back to FIG. 2, the voltage monitoring device 64 measures a line voltage of the connection 46 between the generator 24 and the main power converter 26. An illustration of two voltage monitoring devices 64 is also shown in detail in FIG. 3. In one embodiment, the current monitoring device 62 and the voltage monitoring device 64 may be located at the terminals of the main power converter 26 to measure the current and voltage at the main power converter 26.

The control module 28 is in communication with the generator side converter 52, the line side converter 54, the current monitoring device 62, the voltage monitoring device 64, the breaker 48 and an encoder or tachometer 66 of the generator 24. The tachometer 66 is used to monitor the rotational speed of the generator 24. The control module 28 includes control logic for determining if a fault exists in the connection 46 between the generator 24 and the main power converter 26, within the main power converter 26, with the tachometer 66, a fault in the generator 24 or between the generator 24 and the breaker 48 when the breaker 48 is closed. The control module 28 includes a memory. The memory of the control module stores a threshold current, a threshold voltage, and an expected voltage $V_{Expected}$, which are used to determine if a fault exists. In one embodiment, the threshold current value may range from about zero to about 300 Amps, and the threshold voltage value may range from about 150 to about 600 Volts.

In one approach, the fault detection system 50 determines if a fault exists in the event the breaker 48 is in the open position. In this approach, the control module 28 includes control logic for determining if there is a short circuit condition either within the main power converter 26 or between the main power converter 26 and the breaker 48. In another approach, the control module 28 also includes control logic for determining if a fault condition exists if the breaker 48 is in the closed position, and where the main power converter 26 may or may not be supplying output voltage to the generator 24.

Figure 3:
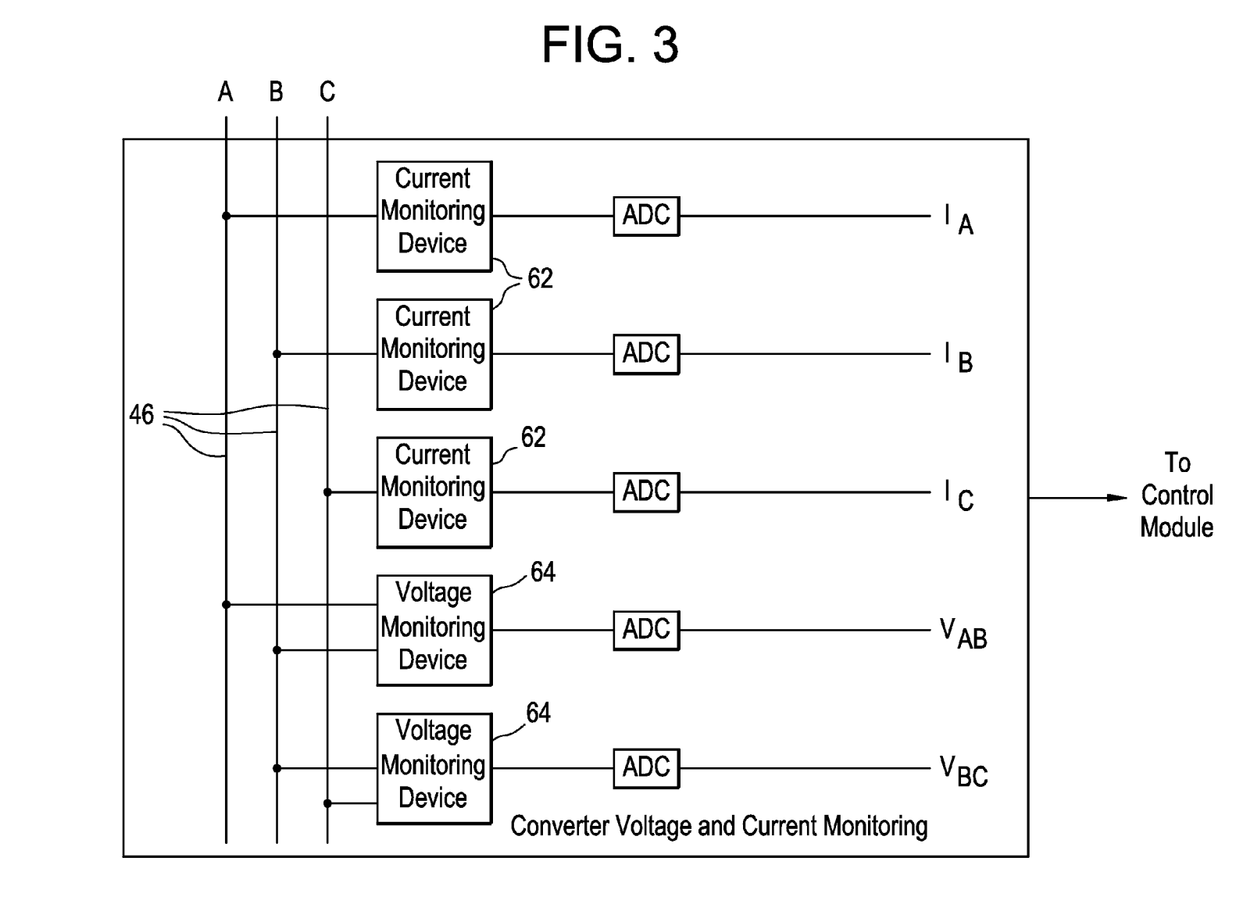
FIG. 3 is a diagram illustrating the connections for a current monitoring device and a voltage monitoring device that are both shown in FIG. 2.

Turning now to FIG. 3, an approach for connecting the current monitoring devices 62 and the voltage monitoring devices 64 to the connections 46 between the generator 24 and the main power converter 26 is illustrated. Specifically, each of the connections 'A', 'B' and 'C' include a current monitoring device 62 and at least one voltage monitoring device 64. The output of the current monitoring devices 62 include $I_A$, $I_B$, and $I_C$, where $I_A$ is the measured current in line 'A', $I_B$ is the current in line 'B', and $I_C$ is the current in line 'C'. The output of the voltage monitoring devices 64 include $V_{AB}$, and $V_{BC}$, where $V_{AB}$ is the measured voltage that appears between lines 'A' and 'B', and $V_{BC}$ is the voltage that appears between lines 'B' and 'C'. The values $I_A$, $I_B$, $I_C$, $V_{AB}$, and $V_{BC}$ are sent to the control module 28.

Figure 4:
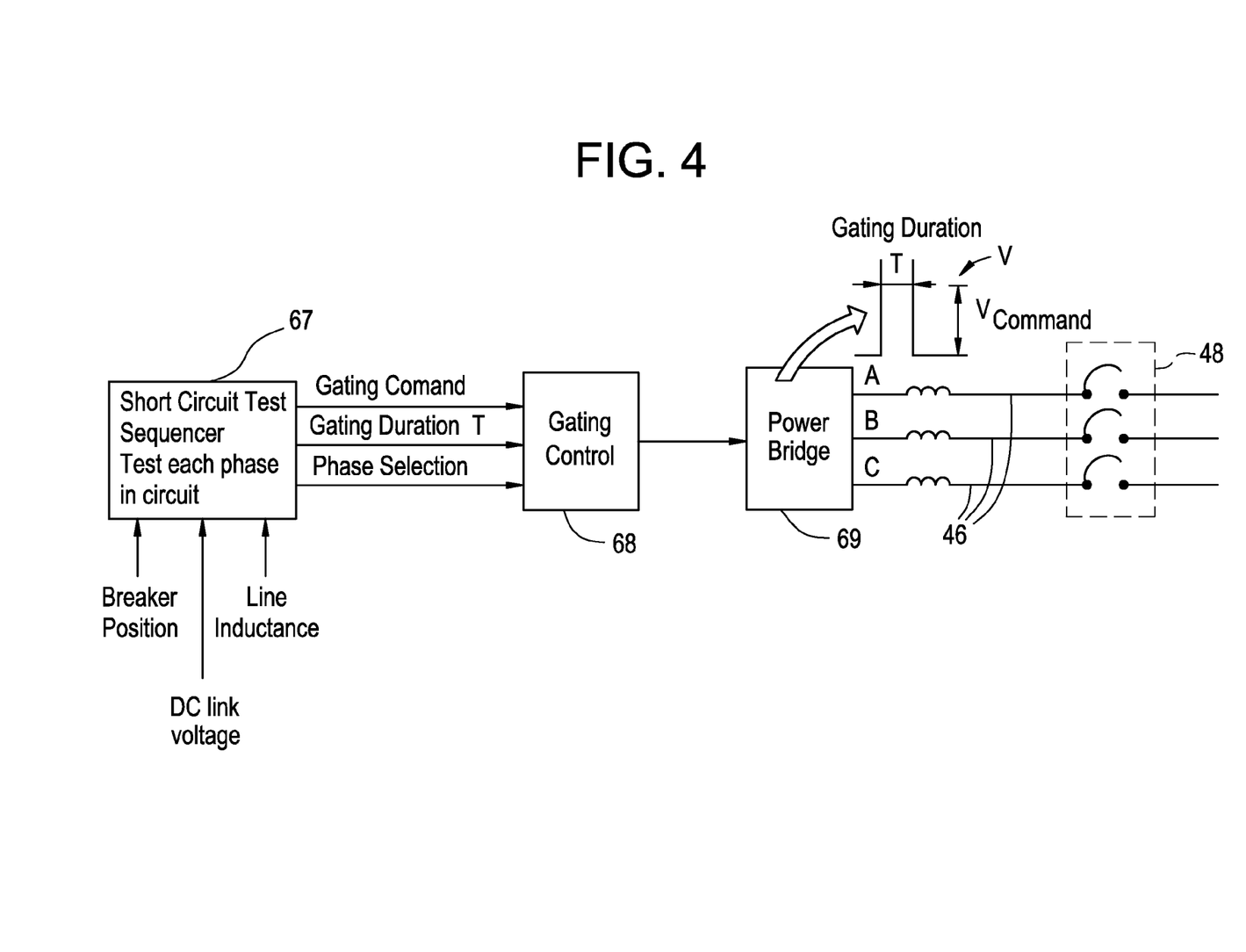
FIG. 4 is a block diagram illustrating an approach for determining a fault using the fault detection system shown in FIG. 2 when a breaker is open.

FIG. 4 is a block diagram of an approach for determining if a fault condition exists if the breakers 48 are in the open position. Specifically, a test sequencer 67 is provided. The test sequencer 67 may be part of the control module 28 (shown in FIG. 2). Alternatively, in another embodiment the test sequencer 67 is a stand-alone unit. Referring now to both FIGS. 2 and 4, the control module 28 includes control logic for monitoring the current monitoring device 62 for the line current and the voltage monitoring device 64 for the line voltage. The control module also includes control logic for monitoring the breaker 48 to determine if the breaker 48 is in the open position or the closed position. The control module 28 includes control logic for determining a DC link voltage by monitoring the DC link capacitor 60. The control module also includes a line inductance value that is specific to the system and is saved in the memory of the control module 28. The control module 28 includes control logic for sending signals to the test sequencer 67 indicating a breaker position, the DC link voltage, and the line inductance.

The test sequencer 67 includes control logic for calculating a Gating Command signal for a specific duration of time. The specific duration of time is indicated in FIG. 4 as a Gating Duration T. Specifically, the Gating Command signal is applied to each of the connections 46 that are denoted as 'A', 'B' and 'C' in a sequencing fashion. In one embodiment the Gating Command signal is first sent to the connection 'A'. Then, the Gating Command signal is sent the connection 'B'. Then, the Gating Command signal is sent to the connection 'C'. Voltage pulses are also produced by simultaneously gating two phases, for example a voltage pulse produced by connections 'A' and 'B', connections 'B' and 'C', and connections 'C' and 'A'. A block 68 labeled Gating Control receives the Gating Command from the test sequencer 67, and sends a command to the Power Bridge 69 to create a test voltage that is sent through the connections 46. In the embodiment as shown in FIG. 4, the test voltage is a voltage pulse V. The Power Bridge 69 is the part of the control module 28 that contains various power switching devices (not shown) such as, for example IGBTs or IGCTs, which create the voltage pulse V. The voltage pulse V is then impressed on one or more of the connections 46 labeled 'A', 'B', or 'C'. The voltage pulse V is a voltage pulse that is configured for lasting for a period of time that is the Gating Duration T (sent from the test sequencer 67). The magnitude of the voltage pulse V is the expected voltage $V_{Expected}$ that is saved in the memory of the control module 28 but with some difference due to the tolerances of the electronics, and is denoted as $V_{Command}$.

Continuing to refer to FIGS. 2 and 4, the current monitoring device 62 and the voltage monitoring device 64 are in communication with the connections 46 and measure the line current and the line voltage to determine if a fault condition is present during the Gating Duration T. Specifically, the control module 28 includes control logic for determining if the line current is greater than the threshold current saved in the memory of the control module 28 when the voltage pulse V is sent. In the event that the line current is greater than the threshold current, the control module 28 includes control logic for indicating that a fault condition exists. That is, a short circuit is present either in the main power converter 26 or between the main power converter 26 and the breaker 48. The control module 28 also includes control logic for determining if the line voltage is a different value than the expected voltage $V_{Expected}$ when the voltage pulse V is sent. Specifically, if the line voltage varies by more than a specified voltage value from the expected voltage $V_{Expected}$, this is an indication that a fault condition exists. For example, in one embodiment, if the line voltage varies by more than about 25% of the expected voltage $V_{Expected}$, this is an indication that a fault condition exists, however it is to be understood that other variations may occur as well. In the event a fault condition is detected, the control module 28 includes control logic for maintaining the breakers 48 in the open position.

Figure 5:
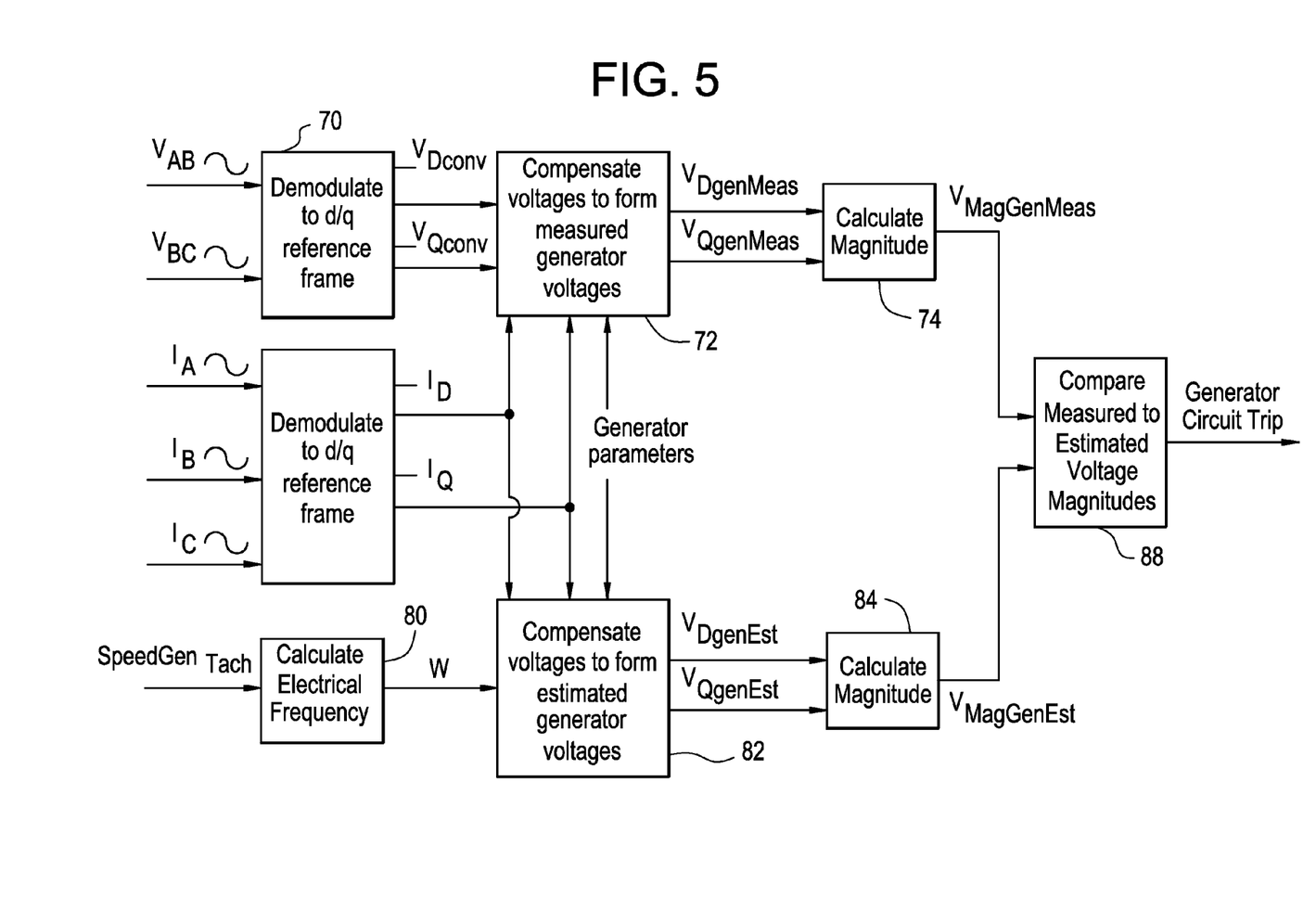
FIG. 5 is a block diagram illustrating another approach for determining a fault using the fault detection system shown in FIG. 2 when the breaker is closed.

FIG. 5 is a block diagram of an approach for determining if a fault condition exists that is executed by the control module 28 (shown in FIG. 2). In the approach as shown in FIG. 5, the breakers 48 are in the closed position and the main power converter 26 may or may not be supplying output voltage to the generator 24. The values $I_A$, $I_B$, $I_C$, $V_{AB}$, $V_{BC}$ and the rotational speed of the generator 24 (shown in FIGS. 1-2), which is denoted as $SpeedGen_{Tach}$, are used in the approach. Referring to FIG. 2, the tachometer 66 is used to monitor the rotational speed of the generator 24. Turning back to FIG. 5, the control module 28 includes control logic for receiving the measured voltages $V_{AB}$ and $V_{BC}$. The measured voltages $V_{AB}$ and $V_{BC}$ represent the voltages that are either measured between the generator 24 and the main power converter 26 at the connections 46 (shown in FIG. 2), or alternatively at the terminals of the main power converter 26. The control module 28 includes control logic for providing the measured voltages $V_{AB}$ and $V_{BC}$ to a demodulator 70. The demodulator 70 includes control logic for converting the measured voltages $V_{AB}$ and $V_{BC}$ into a DC reference frame. Specifically, the control module 28 includes control logic for converting the measured voltages $V_{AB}$ and $V_{BC}$ that are in a stationary three-phase frame into a rotating dq0 frame, where variables and 'q' are DC quantities. Specifically, in one embodiment the control module 28 may use Park's Transformation (also referred to as direct-quadrature-zero transformation) to convert the measured voltages $V_{AB}$ and $V_{BC}$ into DC reference measured voltages $V_{DCONV}$ and $V_{QCONV}$.

The control module 28 further includes control logic for calculating measured voltages of the generator 24 (shown in FIGS. 1-2) in block 72. The measured voltages of the generator 24 are denoted as $V_{DgenMeas}$ and $V_{QgenMeas}$, and are based on the DC reference measured voltages $V_{DCONV}$ and $V_{QCONV}$, the measured current values $I_A$, $I_B$, $I_C$, a cable resistance of the connections 46, an inductance of the connections 46, an internal inductance of the power converter 26, and certain parameters of the generator 24. Specifically, for example, some of the parameters of the generator 24 that may be used to calculate the measured voltage of the generator 24 include, but are not limited to, a d-axis synchronous reactance, a q-axis synchronous reactance, a stator resistance, and a generator flux. A block 74 is then provided to calculate a magnitude of the measured voltages of the generator $V_{DgenMeas}$ and $V_{QgenMeas}$. The magnitude of the measured voltages of the generator is denoted by $V_{MagGenMeas}$.

The control module 28 includes control logic for calculating an electrical frequency ω based on the rotational speed of the generator SpeedGen$_{Tach}$. Calculation of the electrical frequency ω is performed in block 80. The control module 28 includes control logic for estimating voltage at the generator 24 based on the electrical frequency ω of the generator 24, the measured current values $I_A$, $I_B$, $I_C$, generator flux, and the specific parameters of the generator 24 in block 82. The estimated voltages of the generator 24 are denoted as $V_{DgenEst}$ and $V_{QgenEst}$. A block 84 is then provided to calculate the magnitude of the estimated voltages of the generator $V_{DgenEst}$ and $V_{QgenEst}$. The magnitude of the estimated voltages of the generator is denoted by $V_{MagGenEst}$.

The magnitude of the estimated voltages of the generator $V_{MagGenEst}$ and the magnitude of the measured voltages of the generator $V_{MagGenMeas}$ are then both sent to block 88. The control module 28 includes control logic for determining the difference between the magnitude of the estimated voltages of the generator $V_{MagGenEst}$ and the magnitude of the measured voltages of the generator $V_{MagGenMeas}$. The control module 28 further includes control logic for comparing the difference between the magnitude of the estimated voltages $V_{MagGenEst}$ and the magnitude of the measured voltages of the generator $V_{MagGenMeas}$ with the threshold voltage that is saved in the memory of the control module. If the difference between the magnitude of the estimated voltages of the generator $V_{MagGenEst}$ and the magnitude of the measured voltages of the generator $V_{MagGenMeas}$ is greater than the threshold voltage, this is an indication that there is either a short circuit or an open circuit present in the generator 24 (shown in FIG. 2), or if the tachometer 66 (shown in FIG. 2) measuring the rotational speed of the generator 24 is not functioning. In the event a fault condition is detected, the control module 28 includes control logic for switching the breaker 48 (shown in FIGS. 1-2) into the open position.

The fault detection system 50 as illustrated in FIGS. 1-5 determines if a fault exists in the event the breakers 48 are in the open position. Moreover, the fault detection system 50 as described will provide protection to the various components of the wind turbine 10 in the event that a fault condition occurs and the breakers 48 are in the closed position.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A fault detection system, comprising:
   a generator;
   a power converter selectively connected to the generator that is selectively activated to produce a test voltage;
   a breaker located between the generator and the power converter for selectively connecting the generator to the power converter, the breaker including an open position and a closed position;
   a current monitoring device located between the generator and the power converter, the current monitoring device measuring a line current; and
   a control module in communication with the current monitoring device, the breaker, and the power converter, and control module having a memory with a threshold current value stored therein, the control module comprising:
   a control logic for monitoring the breaker to determine if the breaker is in one of the open position and the closed position;
   a control logic for activating the power converter to produce the test voltage if the breaker is in the open position;
   a control logic for monitoring the current monitoring device for the line current;
   a control logic for determining if the line current is greater than the threshold current during a period of time while the test voltage is being produced; and
   a control logic for determining that a fault is present if the breaker is in the open position and if the line current is greater than the threshold current.

2. The fault detection system of claim 1, wherein the control module is in communication with the generator to measure a rotational speed of the generator, and wherein a voltage monitoring device is provided between the generator and the power converter for measuring a line voltage.

3. The fault detection system of claim 2, wherein the control module includes control logic for calculating a measured voltage of the generator, wherein the measured voltage of the generator is based on the line voltage, the line current, a cable resistance value, a cable inductance value, and at least one parameter of the generator.

4. The fault detection system of claim 3, wherein the control module includes control logic for calculating an estimated voltage of the generator, wherein the estimated voltage of the generator is based on the rotational speed of the generator, the line current, and the at least one parameter of the generator.

5. The fault detection system of claim 4, wherein the at least one parameter of the generator is at least one of a d-axis synchronous reactance, a q-axis synchronous reactance, a stator resistance, and a generator flux.

6. The fault detection system of claim 5, wherein the control module includes control logic for calculating a magnitude of the measured voltage of the generator and a control logic for calculating a magnitude of the estimated voltage of the generator.

7. The fault detection system of claim 6, wherein the memory of the control module includes a threshold voltage value, and wherein the control module includes control logic for determining the difference between the magnitude of the measured voltage of the generator and the magnitude of the estimated voltage of the generator.

8. The fault detection system of claim 7, wherein the control module includes control logic determining a generator fault is present if the difference between the magnitude of the estimated voltage of the generator and the magnitude of the measured voltage of the generator is greater than the threshold voltage, and if the breaker is in the closed position.

9. The fault detection system of claim 8, wherein the power converter is one of activated and not activated when the generator fault is determined, and wherein the breaker is switched to the open position if the generator fault is detected.

10. The fault detection system of claim 9, wherein the generator fault is one of a short circuit in a generator circuit, an open circuit in the generator circuit, and if a tachometer measuring the rotational speed of the generator is not functioning.

11. The fault detection system of claim 1, wherein a voltage monitoring device is provided between the generator and the power converter for measuring a line voltage, and wherein the memory of the control module includes an expected voltage.

12. The fault detection system of claim 11, wherein the control module includes control logic for determining that the fault is present if the breaker is in the open position and if the line voltage differs from the expected voltage by a specified voltage value.

13. The fault detection system of claim 1, wherein the control module includes control logic for maintaining the breakers in the open position if the fault is detected.

14. The fault detection system of claim 1, wherein the power converter is a main power converter having a generator side converter and a line side converter.

15. The fault detection system of claim 1, wherein the fault is a short circuit condition that occurs in at least one of the power converter, and between the power converter and the generator.

16. A wind power plant having a fault detection system, comprising:
a wind turbine;
a gearbox connected to the wind turbine through a shaft;
a generator connected to the shaft, the generator having a rotational speed and at least one parameter;
a power converter selectively connected to the generator for being selectively activated to produce a test voltage;
a breaker located between the generator and the power converter for selectively connecting the generator to the power converter, the breaker including an open position and a closed position;
a current monitoring device located between the generator and the power converter, the current monitoring device measuring a line current;
a voltage monitoring device provided between the generator and the power converter for measuring a line voltage; and
a control module in communication with the current monitoring device, the voltage monitoring device, the generator, the breaker and the power converter, and control module having a memory with a threshold current, a threshold voltage, and an expected voltage stored therein, the control module comprising:
a control logic for monitoring the breaker to determine if the breaker is in one of the open position and the closed position;
a control logic for activating the power converter to produce the test voltage if the breaker is in the open position;
a control logic for monitoring the current monitoring device for the line current;
a control logic for determining if the line current is greater than the threshold current during a period of time while the test voltage is being produced;
a control logic for determining that a fault is present if the breaker is in the open position and at least one of if the line current is greater than the threshold current and if the line voltage differs from the expected voltage by a specified voltage value;
a control logic for calculating a measured voltage of the generator, wherein the measured voltage of the generator is based on the line voltage, the line current, a cable resistance value, a cable inductance value, an internal inductance of the power converter and the at least one parameter of the generator;
a control logic for calculating an estimated voltage of the generator, wherein the estimated voltage of the generator is based on the rotational speed of the generator, the line current, and the at least one parameter of the generator;
a control logic for calculating a magnitude of the measured voltage of the generator and a magnitude of the estimated voltage of the generator;
a control logic for determining the difference between the magnitude of the measured voltage of the generator and the magnitude of the estimated voltage of the generator; and
a control logic for determining a generator fault is present if the difference between the magnitude of the estimated voltage of the generator and the magnitude of the measured voltage of the generator is greater than the threshold voltage, and if the breaker is in the closed position.

17. The wind power plant of claim 16, wherein the at least one parameter of the generator is at least one of a d-axis synchronous reactance, a q-axis synchronous reactance, a stator resistance, and a generator flux.

18. The wind power plant of claim 16, wherein the power converter is one of activated and not activated when the generator fault is determined, and wherein the breaker is switched to the open position if the generator fault is detected.

19. The wind power plant of claim 16, wherein the generator fault is one of a short circuit in a generator circuit, an open circuit in the generator circuit, and if a tachometer measuring the rotational speed of the generator is not functioning.

20. The wind power plant of claim 16, wherein the control module includes control logic for maintaining the breakers in the open position if the fault is present.

* * * * *